(12) United States Patent
Abuelma'atti et al.

(10) Patent No.: US 9,619,596 B2
(45) Date of Patent: Apr. 11, 2017

(54) FLOATING MEMRISTOR EMULATOR

(71) Applicant: KING FAHD UNIVERSITY OF PETROLEUM AND MINERALS, Dhahran (SA)

(72) Inventors: Muhammad Taher Abuelma'atti, Dhahran (SA); Zainulabideen Jamal Khalifa, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 97 days.

(21) Appl. No.: 14/748,192

(22) Filed: Jun. 23, 2015

(65) Prior Publication Data

US 2016/0378896 A1    Dec. 29, 2016

(51) Int. Cl.
    *H03B 1/00*     (2006.01)
    *H03K 3/00*     (2006.01)
    *G06F 17/50*     (2006.01)
    *G06F 17/10*     (2006.01)

(52) U.S. Cl.
    CPC .......... *G06F 17/5036* (2013.01); *G06F 17/10* (2013.01)

(58) Field of Classification Search
    USPC ................................................. 327/108–112
    See application file for complete search history.

(56) References Cited

U.S. PATENT DOCUMENTS

| | | | | |
|---|---|---|---|---|
| 8,854,148 B1* | 10/2014 | Abuelma'atti | ........... | H03B 5/26 331/108 B |
| 8,860,518 B1* | 10/2014 | Abuelma'atti | ....... | H03K 3/0231 331/111 |
| 9,019,030 B1* | 4/2015 | Abuelma'atti | ........ | H04L 27/122 331/45 |
| 9,299,922 B1* | 3/2016 | Abuelma'atti | ........... | G06G 7/62 |
| 2011/0119036 A1* | 5/2011 | Pino | ..................... | G06F 17/5036 703/2 |
| 2011/0204310 A1* | 8/2011 | Strachan | ................ | B82Y 10/00 257/2 |
| 2012/0194967 A1* | 8/2012 | Keane | .................... | H01C 13/00 361/437 |

(Continued)

FOREIGN PATENT DOCUMENTS

| | | |
|---|---|---|
| CN | 103297025 A | 9/2013 |
| CN | 103729518 A | 4/2014 |

OTHER PUBLICATIONS

Sanchez-Lopez et al., "A floating analog memristor emulator circuit," IEEE Transactions on Circuits and Systems—II: Express Briefs, vol. 61, pp. 309-313, Apr. 22, 2014.

(Continued)

*Primary Examiner* — Adam Houston
(74) *Attorney, Agent, or Firm* — Richard C. Litman

(57) ABSTRACT

The floating memristor emulator is based on a circuit implementation that uses grounded capacitors and CFOAs in addition to combinations of diodes and resistors to provide the required nonlinearity and time constants. This circuit results in low power consumption, cost reduction and ease of implementation because it avoids the use of multipliers, ADCs and RDACs. The present circuit is used in an FM demodulator, which exploits the frequency-dependence of the memristance. Successful use in the FM demodulator confirmed the functionality of the present floating memristor emulator circuit.

16 Claims, 8 Drawing Sheets

(56) References Cited

U.S. PATENT DOCUMENTS

2014/0282314 A1   9/2014   Mohanty et al.

OTHER PUBLICATIONS

Yeşil et al., "A new DDCC based memristor emulator circuit and its applications," Microelectronics Journal, vol. 45, Issue 3, pp. 282-287, Mar. 2014.

* cited by examiner

US 9,619,596 B2

FLOATING MEMRISTOR EMULATOR

BACKGROUND OF THE INVENTION

1. Field of the Invention

The present invention relates to memristors, and particularly to a floating memristor emulator that can be used in frequency-to-voltage conversion.

2. Description of the Related Art

Since its inception, several emulators have been presented for the grounded memristor. However, only few floating memristor emulators are available in the literature. Those few designs have numerous components, which present size and power consumption problems.

Thus, a floating memristor emulator solving the aforementioned problems is desired.

SUMMARY OF THE INVENTION

The floating memristor emulator is based on a circuit implementation that uses grounded capacitors and CFOAs in addition to combinations of diodes and resistors to provide the required nonlinearity and time constants. This circuit results in low power consumption, cost reduction and ease of implementation because it avoids the use of multipliers, ADCs and RDACs. The present circuit may be used in an FM demodulator, which exploits the frequency-dependence of the memristance. Successful use in the FM demodulator confirmed the functionality of the present floating memristor emulator circuit.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
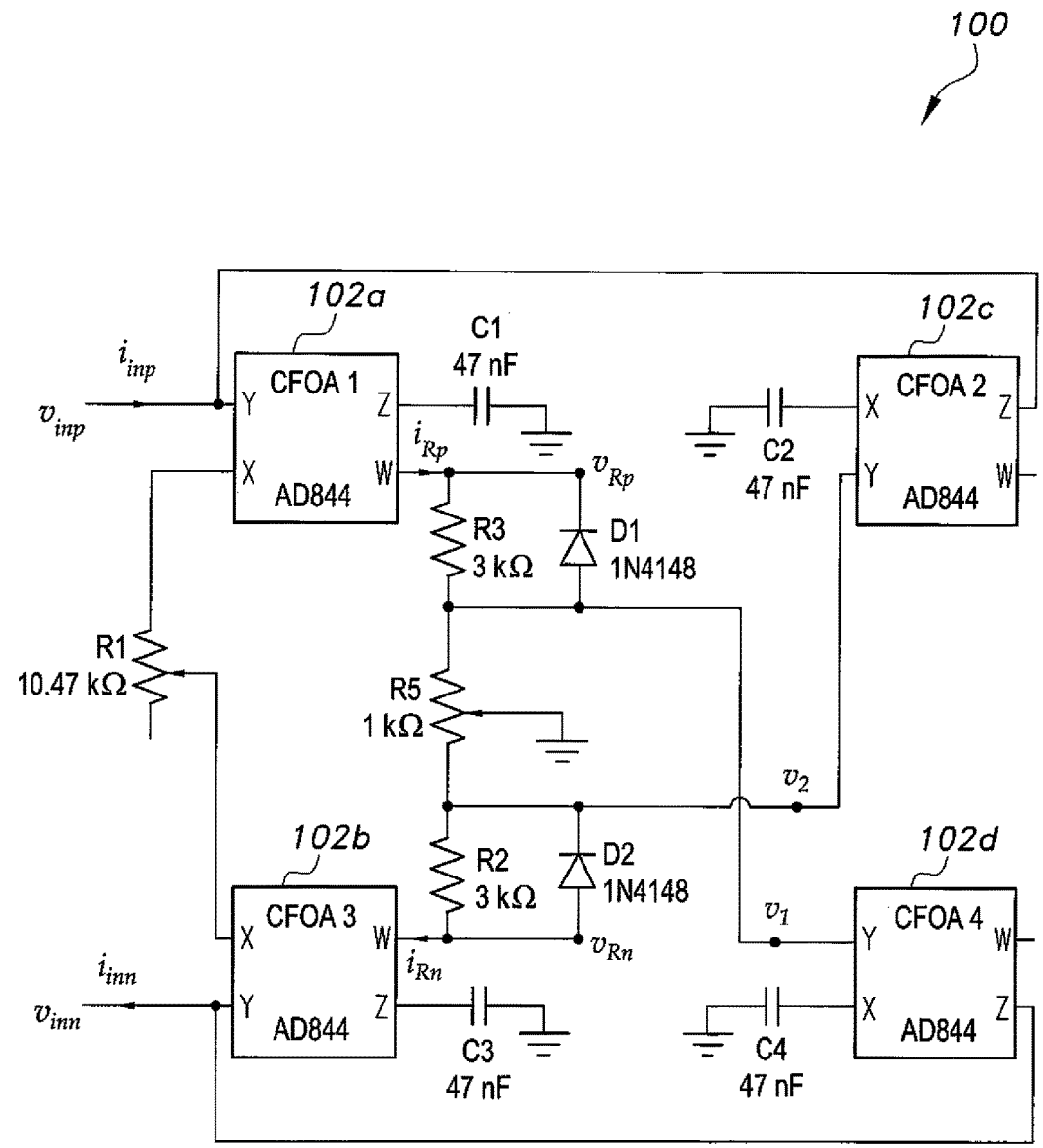
FIG. 1 is a schematic diagram of a floating memristor emulator according to the present invention.

The present floating memristor emulator circuit includes four current feedback operational amplifiers (CFOA's 102a, 102b, 102c, and 102d), configured as shown in FIG. 1. The first 102a, second 102c, third 102b, and fourth 102d current feedback operational amplifiers (CFOAs), each have y, x, z, and w terminals. The y terminal of first CFOA1 102a is connected two the z terminal of the second CFOA2 102c. The y terminal of the third CFOA3 102b is connected to the z terminal of the fourth CFOA4 102d. A differential voltage input, $v_{inp}$, $v_{inn}$ is formed from the y terminals of the first and third CFOAs (102a, 102b). The x terminals of CFOA1 102a and CFOA3 102b are in operable communication with each other. For example, a potentiometer $R_1$ may be connected between the x terminals of CFOA1 102a and CFOA3 102b (the wiper portion being connected to CFOA3 102b). Grounded capacitors $C_1$ through $C_4$ are connected to their respective CFOAs (102a, 102c, 102b, and 102d). A parallel combination ($R_3$ and $D_1$) has a cathode portion of D) connected to the w terminal of COFA1 102a. The $R_3$, $D_1$ combination is connected in series with the upper part of the potentiometer $R_5$ which is connected to the y terminal of CFOA4 102d. The wiper portion of potentiometer $R_5$ is connected to ground. A parallel combination ($R_2$ and $D_2$) has an anode portion of $D_2$ connected to the w terminal of COFA3 102b. The $R_2$, $D_2$ combination is connected in series with the lower part of the potentiometer $R_5$, which is connected to they terminal of CFOA2 102c. The input voltage produces a current through the resistance $R_1$ given by:

$$i_{R_1} = (v_{inp} - v_{inn})/R_1. \quad (1)$$

This current will flow outward from terminal x of CFOA1 (102a) and inward into terminal x of CFOA3 102b. This current will be induced in terminal z of CFOA1 (102a), where it will be integrated by the capacitor $C_1$ to produce a voltage given by:

$$v_{R_p} = \frac{1}{C_1} \int \frac{v_{inp} - v_{inn}}{R_1} dt. \quad (2)$$

This voltage will be induced on terminal w of CFOA1 (102a) and will produce an outward current from terminal w of CFOA1 (102a), $i_{R_p}$ through the parallel combination of $R_3$ and $D_1$ in series with the upper part of the potentiometer $R_5$. This current can be expressed as:

$$i_{R_p} = \frac{v_{R_p}}{R_{5upper} + R_{eq1}}. \quad (3)$$

In equation (3), $R_{5upper}$ is the resistance of the upper part of the potentiometer $R_5$ and $R_{eq1}$ is a nonlinear resistance that depends on the status of the diode $D_1$. The voltage at terminal y of the CFOA 4 (102d) will depend on the status of the diode $D_1$. This voltage can be expressed as:

$$v_1 = \frac{v_{R_p} R_{5upper}}{R_{5upper} + R_{eq1}}. \tag{4}$$

The voltage $v_1$ will be induced on terminal x of the CFOA4 (102d) and will be differentiated by the capacitor $C_4$. Thus, the outward current in the lower input terminal will be given by:

$$i_{inn} = C_4 \frac{dv_1}{dt}. \tag{5}$$

In a similar way the current $i_{R_1}$ will be induced in the terminal z of CFOA3 (102b) and will be integrated by the capacitor $C_3$ to produce a voltage given by:

$$v_{R_n} = \frac{-1}{C_3} \int \frac{v_{inp} - v_{inn}}{R_1} dt. \tag{6}$$

In equations (2) and (6), the voltage $v_M = v_{inp} - v_{inn}$ is the differential input voltage. The voltage $v_{Rn}$ will be induced on terminal w of CFOA3 (102b) and will produce an inward current $i_{Rn}$ through the parallel combination of $R_2$ and $D_2$ in series with the lower part of the potentiometer $R_5$. This current can be expressed as:

$$i_{R_n} = \frac{-v_{R_n}}{R_{5lower} + R_{eq2}}. \tag{7}$$

In equation (6) $R_{5lower}$ is the resistance of the lower part of the potentiometer $R_5$ and $R_{eq2}$ is a nonlinear resistance that depends on the status of the diode $D_2$. The voltage at terminal y of CFOA2 (102c) can be expressed as:

$$v_2 = \frac{v_{R_n} R_{5lower}}{R_{5lower} + R_{eq2}}. \tag{8}$$

In equation (8), $R_{5lower}$ is the resistance of the lower part of the potentiometer $R_5$ and $R_{eq2}$ is a nonlinear resistance that depends on the status of the diode. This voltage will be induced on terminal x of CFOA2 (102c) and will be differentiated by the capacitor $C_2$. Thus, the inward current in the upper input terminal will be given by:

$$i_{inp} = -C_2 \frac{dv_2}{dt}. \tag{9}$$

Assuming that the diodes $D_1$ and $D_2$ are identical, $C_1 = C_3 = C_i$, $C_2 = C_4 = C_d$, $R_2 = R_3$, and the potentiometer $R_5$ is midway with $$R_{5upper} = R_{5lower} = \frac{1}{2} R_5,$$

then $R_{eq1} = R_{eq2} = R_{eq}$, $$v_{R_n} = -v_{R_p} = -\frac{1}{2} v_R,$$

$i_{Rn} = i_{Rp} = i_R$ and $v_2 = -v_1$. Combining equations (1) and (6), the voltage $v_R = v_{Rp} - v_{Rn}$ can be expressed as:

$$v_R = v_{R_p} - v_{R_n} = \frac{2}{C_i R_1} \int v_m dt. \tag{10}$$

Using equations (2), (3), (6) and (7) the current $i_R = i_{Rp} = i_{Rn}$ can be expressed as:

$$i_R = \frac{1}{k_1} \int v_m dt. \tag{11}$$

In equation (11) the parameter $k_1$ is given by, $$k_1 = \frac{(R_5 + 2R_{eq}) C_i R_1}{2}. \tag{12}$$

Also combining equations (5) and (9) the input current can be expressed as:

$$i_M = i_{inp} = i_{inn} = k_2 \frac{dv_R}{dt}. \tag{13}$$

In equation (13) the parameter $k_2$ is given by:

$$k_2 = \frac{C_d R_5}{R_5 + 2R_{eq}}. \tag{14}$$

Figure 2A:
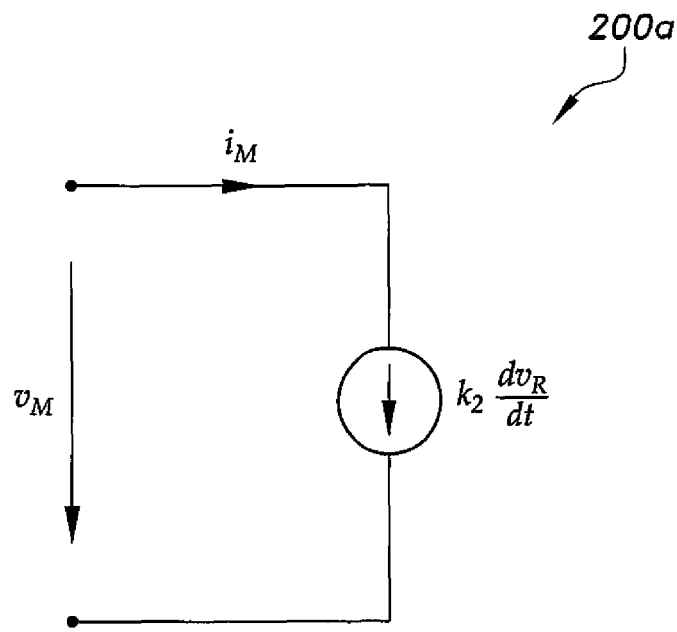
FIG. 2A is a schematic diagram showing an $I_M$ model in terms of input current for a floating memristor emulator according to the present invention.
Figure 2B:
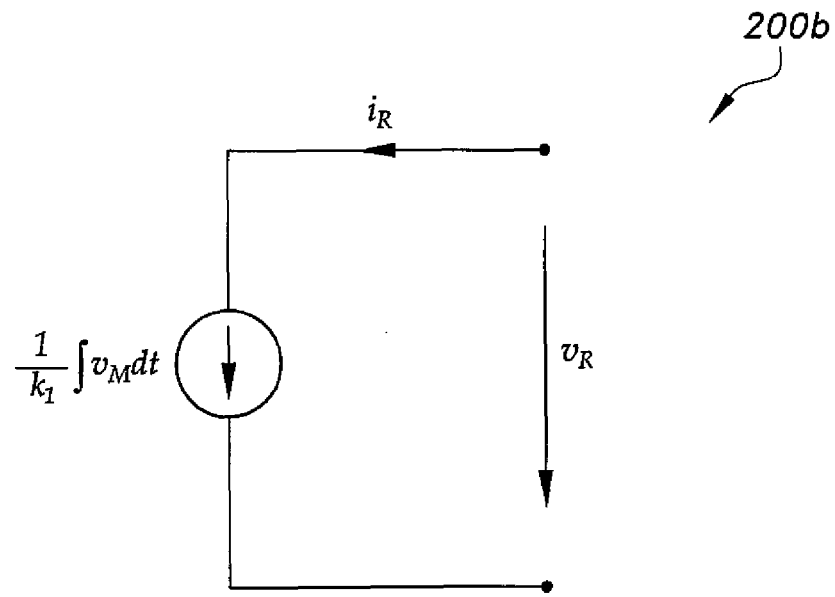
FIG. 2B is a schematic diagram showing an $I_R$ model in terms of emulator current for a floating memristor emulator according to the present invention.
Figure 3A:
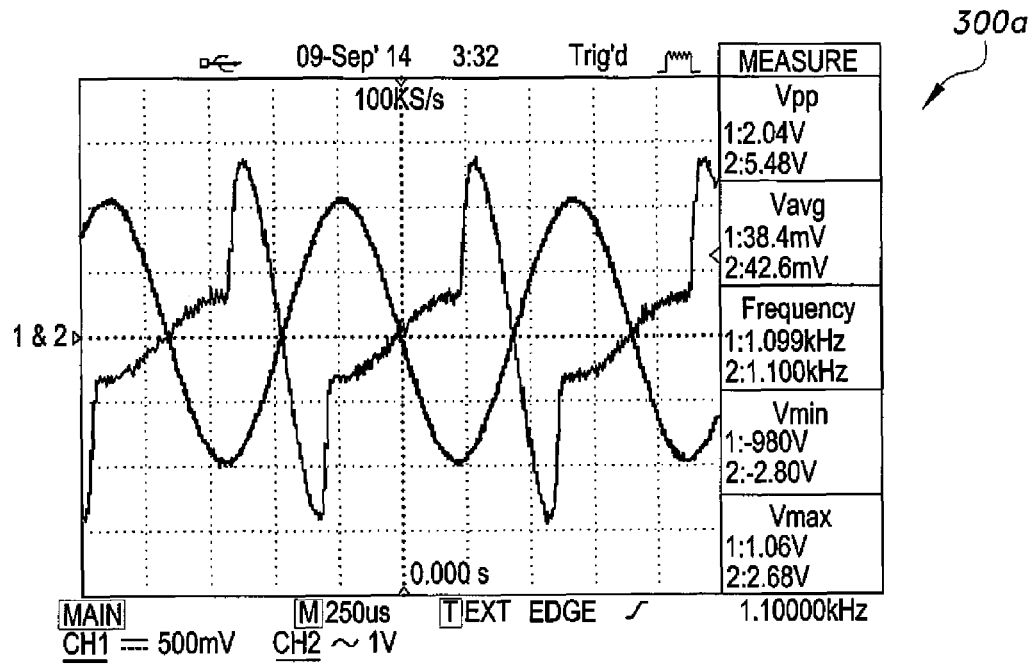
FIG. 3A is a plot showing current and voltage waveform characteristics of the floating memristor emulator according to the present invention.
Figure 3B:
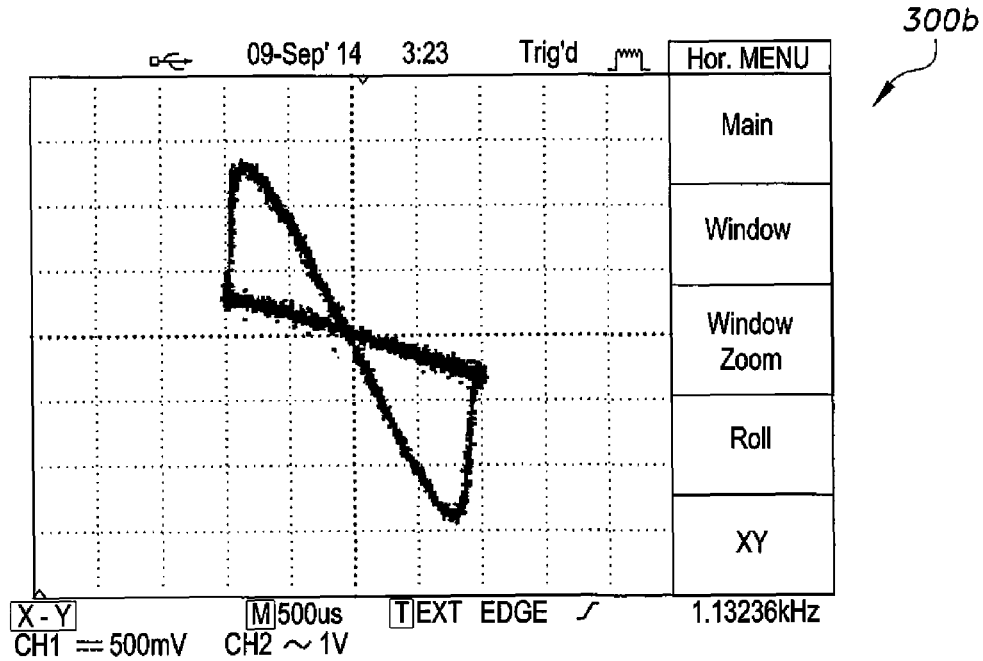
FIG. 3B is a plot showing current-voltage characteristics with a wide difference in the resistance values of the floating memristor emulator according to the present invention.
Figure 4A:
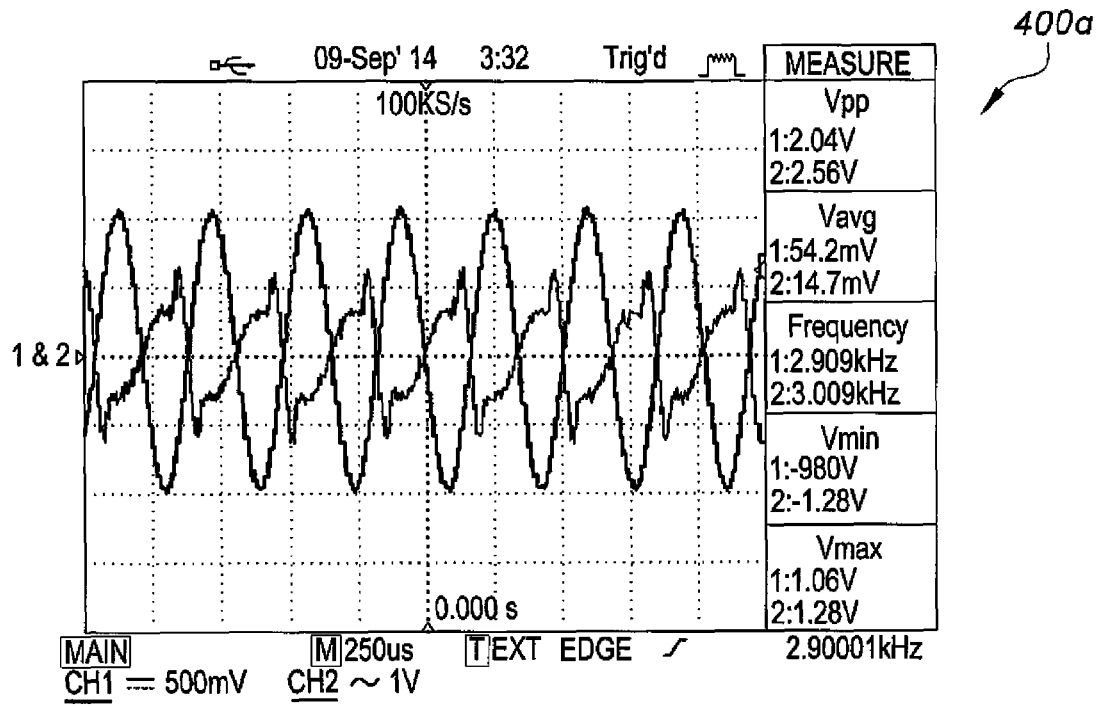
FIG. 4A is a plot showing current and voltage waveform characteristics of the floating memristor emulator according to the present invention at 2.9 kHz.
Figure 4B:
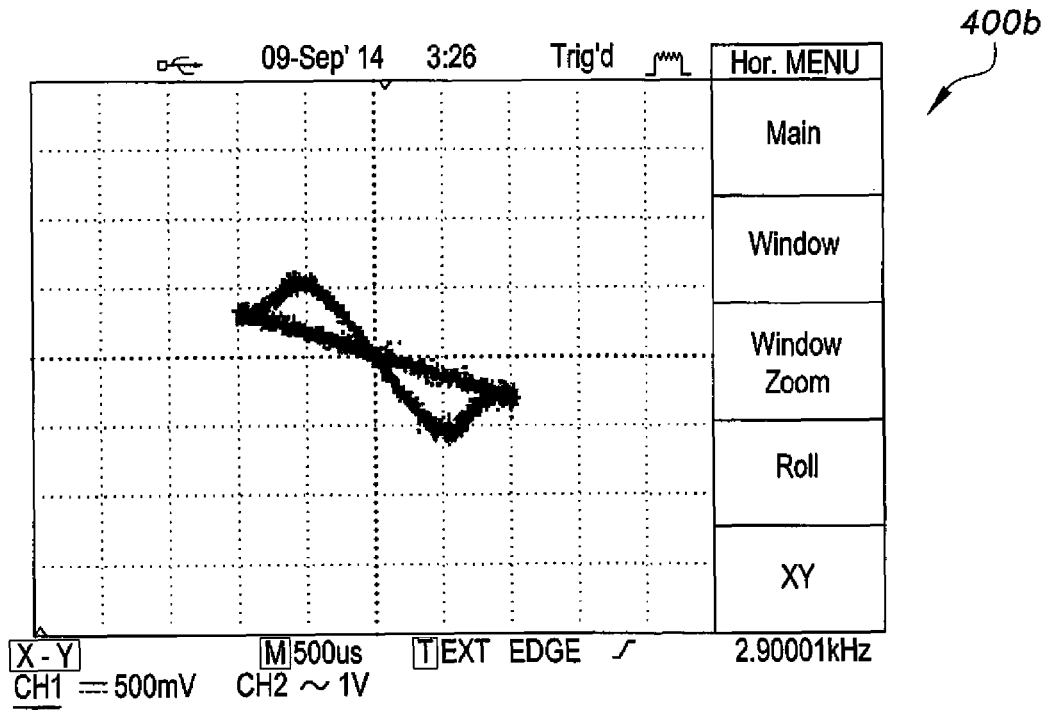
FIG. 4B is a plot showing current-voltage characteristics with narrow difference in resistance values at 2.9 kHz of the floating memristor emulator according to the present invention.
Figure 5:
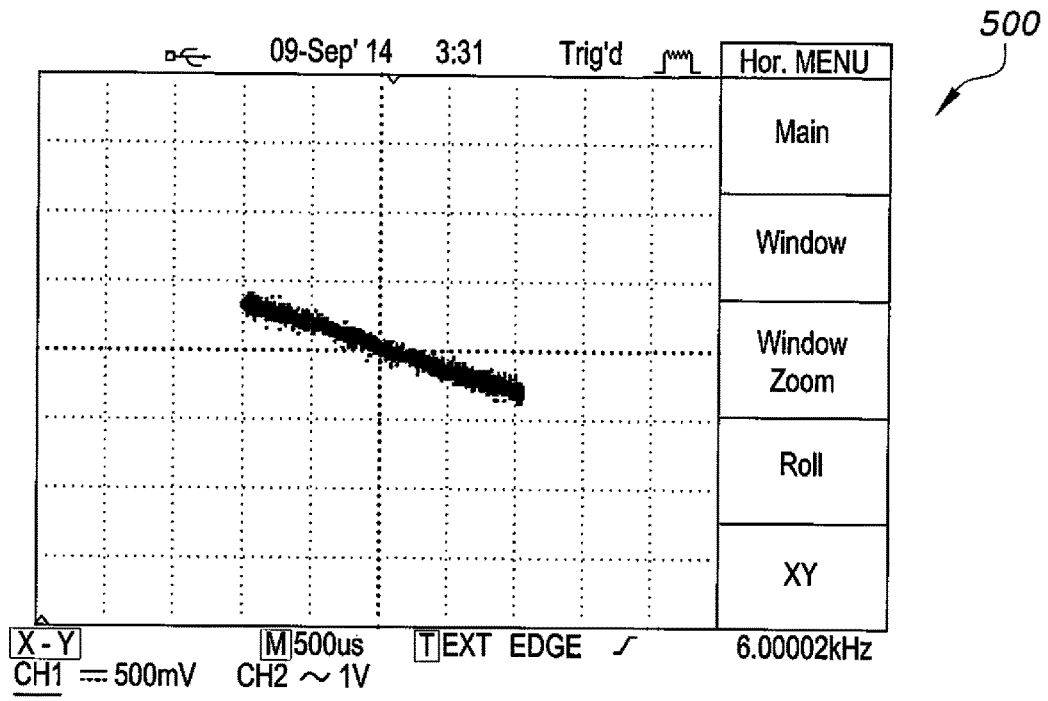
FIG. 5 is a plot showing behavior at 6.0 kHz of the floating memristor emulator according to the present invention.

Equations (11) and (13) can be represented by models 200a and 200b of FIGS. 2A and 2B, respectively. Models 200a and 200b correspond to a voltage-controlled memristor, where the voltage exciting the memristor $v_M$ is integrated in the form of a current $i_R$. This current is converted via a nonlinear resistor to voltage $v_R$, and the voltage is transformed by differentiation to the memristor current $i_M$. As stated supra, the present memristor emulator circuit uses four CFOAs. They are of type AD844. Simple Germanium (Ge) diodes in the circuit provide the necessary nonlinear function. Four equal-valued, grounded capacitors (47 nF) complete the z and x terminal connections for memristor circuit 100. Two equal-valued resistors (3 kΩ) complete the w and y terminal connections for memristor circuit 100. The variability of the resistor connections, wherein the equal-valued 3 kΩ resistors are interconnected by a 1 kΩ potentiometer, allows for compensation for any mismatch between the capacitors ($C_1$, $C_2$, $C_3$, and $C_4$).

Experimental results of the floating memristor emulator circuit 100 are shown in plots 300a, 300b, 400a, 400b, and 500 of FIGS. 3A, 3B, 4A, 4B, and 5, respectively. Inspection of the plots clearly shows the frequency dependence of the memristance. As the frequency increases, the memristor emulator tends to behave as a normal resistor.

Figure 6:
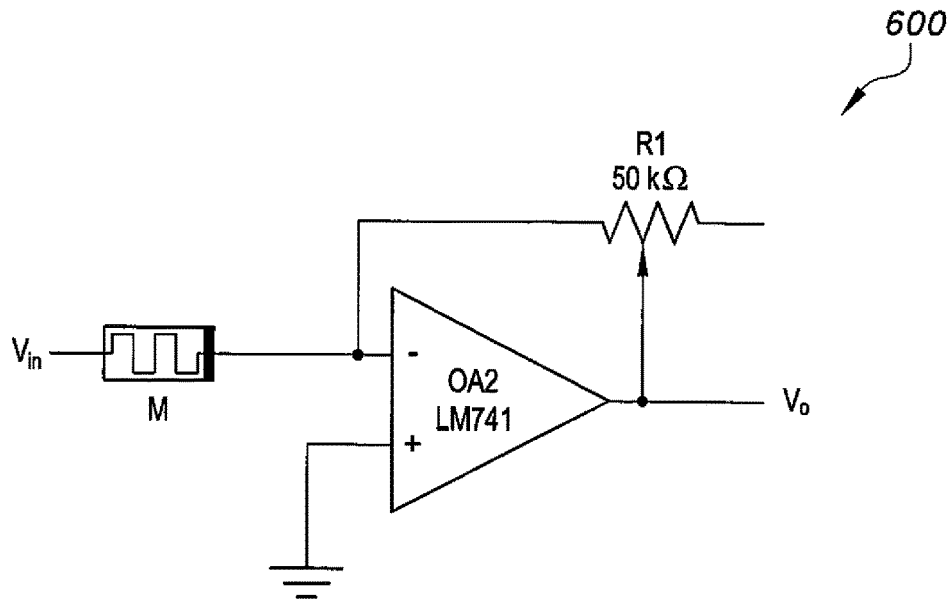
FIG. 6 is a schematic diagram showing a test circuit for the floating memristor emulator according to the present invention.
Figure 7:
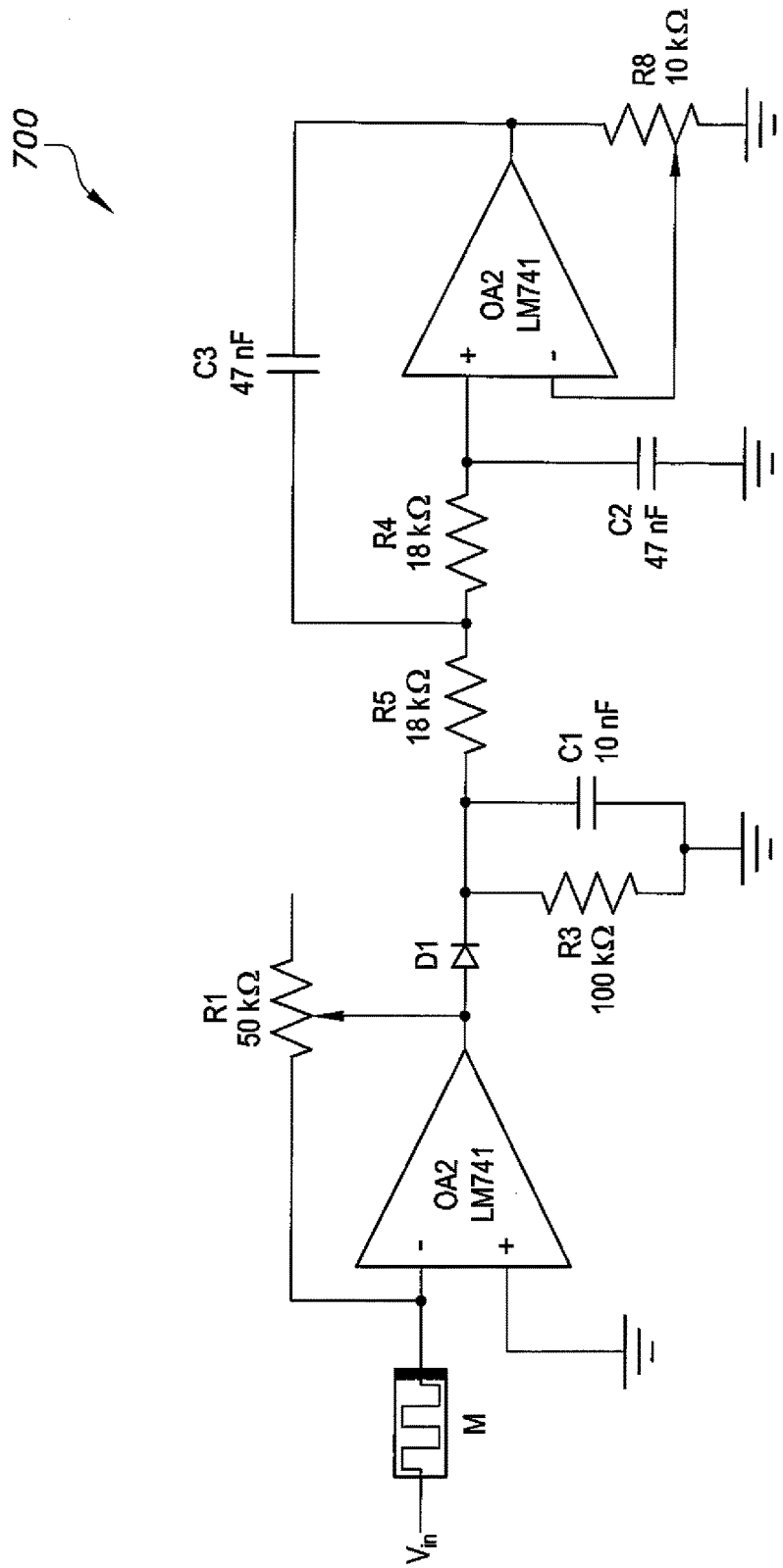
FIG. 7 is a schematic diagram showing a FM demodulator using the floating memristor emulator according to the present invention.
Figure 8:
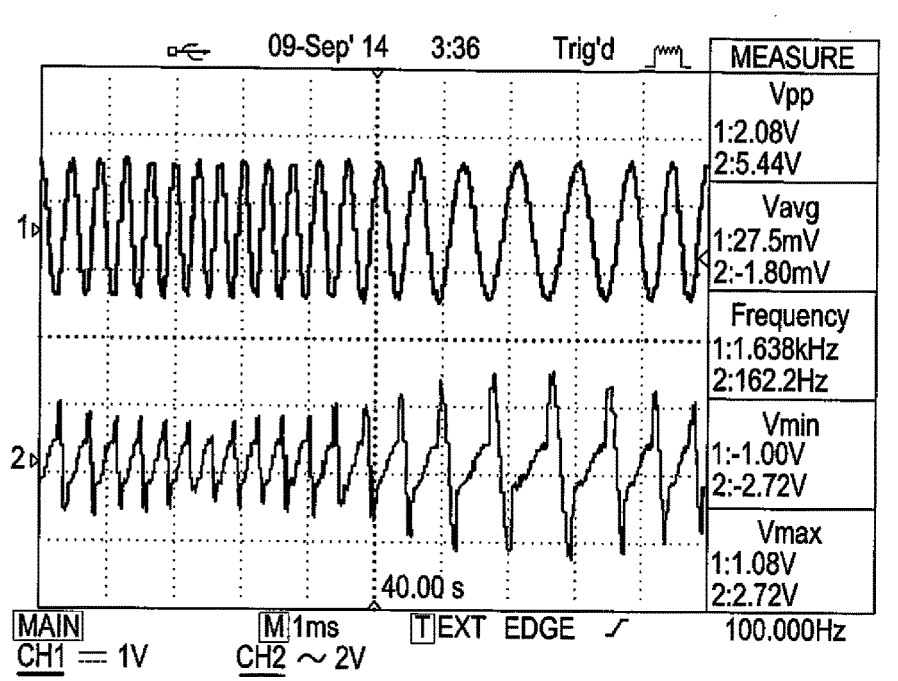
FIG. 8 is a plot showing FM and the converted AM of the FM demodulator using the floating memristor emulator according to the present invention.
Figure 9:
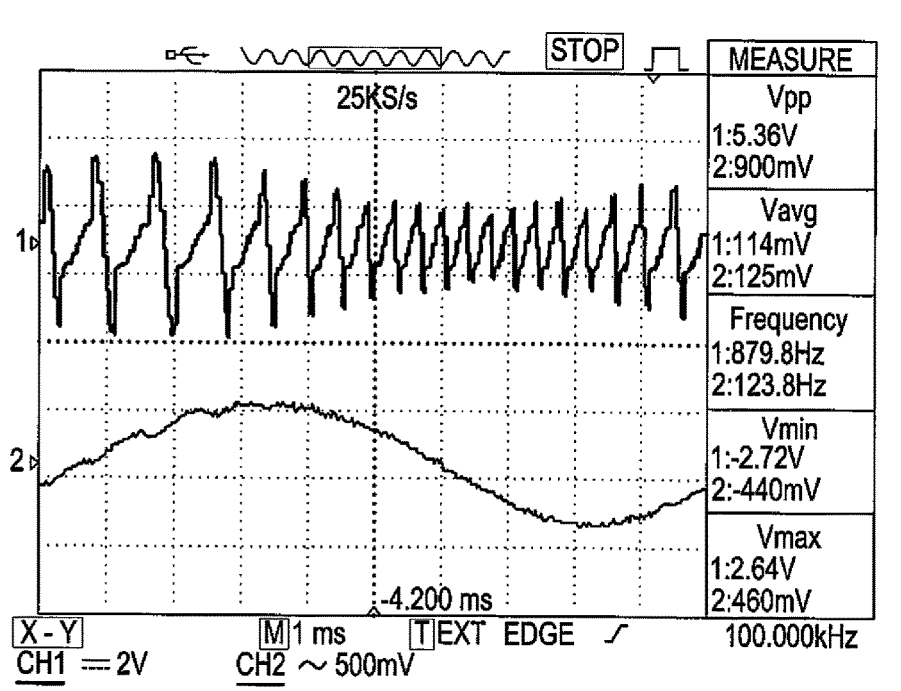
FIG. 9 is a plot showing the converted AM signal and the output demodulated signal of the FM demodulator using the floating memristor emulator according to the present invention.
Figure 10:
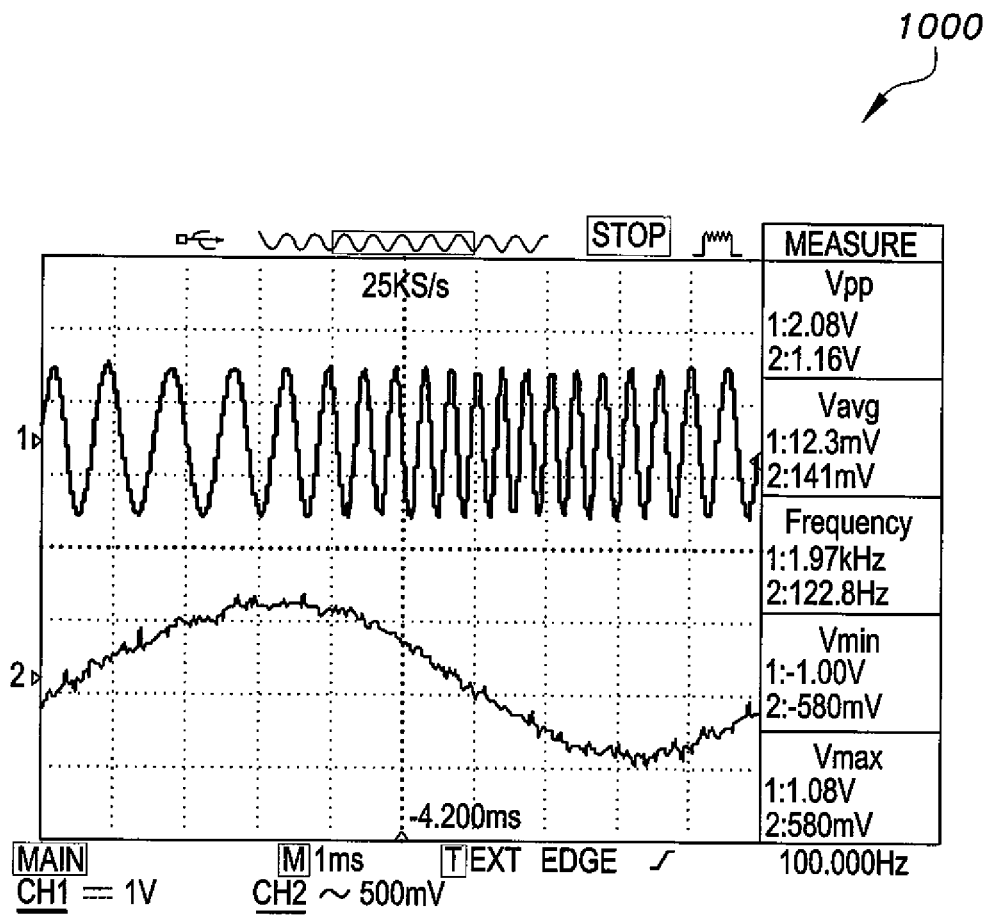
FIG. 10 is a plot showing the input FM signal and the output modulating signal at the output of the low pass filter connected to the FM demodulator using the floating memristor emulator according to the present invention.

The functionality of the present floating memristor emulator circuit 100 of FIG. 1 was tested by using it in FM-to-AM conversion. The FM-AM conversion circuit 600 shown in FIG. 6 is a simple frequency dependent, variable-gain inverting amplifier exploiting to advantage the frequency dependence of the memristance to form an FM discriminator circuit that is used in the first stage of the FM demodulator 700 shown in FIG. 7. The FM-AM conversion circuit 600 was tested using an FM signal formed of a carrier of frequency=2 kHz, a modulating frequency=100 Hz and frequency deviation=900 Hz. As shown in FIG. 7, the output of FM-to-AM converter (discriminator) 600 circuit of FIG. 6 was applied to an envelope detector of the FM demodulator 700, which fully demodulates an FM signal input to the FM discriminator. A low pass filter follows the envelope detector. The first stage of the FM demodulator uses the floating memristor emulator 100 connected to the negative input of an operational amplifier OA1 with resistive negative feedback (R1). The positive input of OA1 is connected to ground. Operational amplifier OA1's output feeds a second stage (envelope detector) of the FM demodulator. The results obtained are shown in plots 800-1000 of FIGS. 8-10, respectively. Inspection of plots 800 through 1000 clearly shows that the present FM-to-AM converter works as expected and exploits to advantage the frequency dependence of the floating memristor emulator 100 of FIG. 1.

It is to be understood that the present invention is not limited to the embodiments described above, but encompasses any and all embodiments within the scope of the following claims.

We claim:

1. A floating memristor emulator, comprising:
   first, second, third, and fourth current feedback operational amplifiers (CFOAs), each of the CFOAs having y, x, z, and w terminals, the y terminal of the first CFOA being connected to the z terminal of the second CFOA, the y terminal of the third CFOA being connected to the z terminal of the fourth CFOA, and the x terminals of the first and third CFOAs being in operable communication with each other;
   grounded capacitors $C_1$ and $C_3$ connected to the respective z terminal of CFOAs one and three;
   grounded capacitors $C_2$ and $C_4$ connected to the respective x terminal of CFOAs two and four;
   a differential voltage input, $v_{inp}$, $v_{inn}$ formed from the y terminals of the first and third CFOAs;
   a potentiometer $R_5$ having first and second end terminals and a wiper, the first terminal being connected to the y terminal of the fourth CFOA, the second terminal being connected to the y terminal of the second CFOA, and the wiper being connected to ground;
   a first parallel resistor-diode combination $R_3$ and $D_1$ connected in series with the first terminal of the potentiometer $R_5$ and having a cathode portion of the diode $D_1$ connected to the w terminal of the first CFOA; and
   a second parallel resistor-diode combination $R_2$ and $D_2$ connected in series with the second terminal of the potentiometer $R_5$ and having an anode portion of the diode $D_2$ connected to the w terminal of the third CFOA.

2. The floating memristor emulator according to claim 1, further comprising a potentiometer $R_1$ connected between the x terminals of the first and third CFOAs to define the operable communication between the x terminals, the wiper of potentiometer $R_1$ being connected to the third CFOA.

3. The floating memristor emulator according to claim 2, wherein current through the potentiometer $R_1$ is characterized by the relation:

$$i_{R_1} = (v_{inp} - v_{inn})/R_1,$$

where $v_{inp}$ is an input voltage at the y terminal of the first CFOA and $v_{inn}$ is an input voltage at the y terminal of the third CFOA.

4. The floating memristor emulator according to claim 3, wherein voltage at the w terminal of the first CFOA is characterized by the relation:

$$v_{R_p} = \frac{1}{C_1} \int \frac{v_{inp} - v_{inn}}{R_1} dt.$$

5. The floating memristor emulator according to claim 4, wherein current at the w terminal of the first CFOA is characterized by the relation:

$$i_{R_p} = \frac{v_{R_p}}{R_{5upper} + R_{eq1}},$$

where $R_{5upper}$ is the first terminal of potentiometer $R_5$, and $R_{eq1}$ is a nonlinear equivalent resistance depending on the status of the diode $D_1$.

6. The floating memristor emulator according to claim 5, wherein the voltage $v_1$ at terminal y of the fourth CFOA is characterized by the relation:

$$v_1 = \frac{v_{R_p} R_{5upper}}{R_{5upper} + R_{eq1}}.$$

7. The floating memristor emulator according to claim 6, wherein an outward current $i_{inn}$ from the y terminal of the third CFOA is characterized by the relation:

$$i_{inn} = C_4 \frac{dv_1}{dt}.$$

8. The floating memristor emulator according to claim 7, wherein a voltage $v_{R_n}$ at the w terminal of the third CFOA is characterized by the relation:

$$v_{R_n} = \frac{-1}{C_3} \int \frac{v_{inp} - v_{inn}}{R_1} dt.$$

9. The floating memristor emulator according to claim 8, wherein current $i_{R_n}$ at the w terminal of the third CFOA is characterized by the relation:

$$i_{R_n} = \frac{-v_{R_n}}{R_{5lower} + R_{eq2}},$$

where $R_{5lower}$ is the second terminal of potentiometer $R_5$, and $R_{eq2}$ is a nonlinear equivalent resistance depending on the status of the diode $D_2$.

10. The floating memristor emulator according to claim 9, wherein the voltage $v_2$ at terminal y of the second CFOA is characterized by the relation:

$$v_2 = \frac{v_{R_n} R_{5lower}}{R_{5lower} + R_{eq2}}.$$

11. The floating memristor emulator according to claim 10, wherein an inward current $i_{inp}$ on the y terminal of the first CFOA is characterized by the relation:

$$i_{inp} = -C_2 \frac{dv_2}{dt}.$$

12. The floating memristor emulator according to claim 11, wherein:
diodes $D_1$ and $D_2$ have identical value;
an input capacitance $C_i$ is characterized by the relation $C_1 = C_3$;
an output capacitance $C_d$ is characterized by the relation $C_2 = C_4$;
the wiper of potentiometer is set midway with $$R_{5lower} = R_{5lower} = \frac{1}{2} R_5;$$

and
a differential voltage $v_R$ from the w terminals of the first and third CFOAs is characterized by the relation:

$$v_R = v_{R_p} - v_{R_n} = \frac{2}{C_i R_1} \int v_M dt,$$

where $v_M$ is a differential input voltage characterized by the relation $v_{inp} - v_{inn}$.

13. The floating memristor emulator according to claim 12, wherein a differential current $i_R = i_{R_p} = -i_{R_n}$ is characterized by the relation:

$$i_R = \frac{1}{k_1} \int v_M dt,$$

where $k_1$ is a parameter characterized by the relation:

$$k_1 = \frac{(R_5 + 2R_{eq}) C_i R_1}{2}.$$

14. The floating memristor emulator according to claim 13, wherein a differential input current $i_M$ is characterized by the relation:

$$i_M = i_{inp} = i_{inn} = k_2 \frac{dv_R}{dt},$$

where $k_2$ is a parameter characterized by the relation:

$$k_2 = \frac{C_d R_5}{R_5 + 2R_{eq}}.$$

15. The floating memristor emulator according to claim 14, further comprising:
an inverting amplifier having an input and an output, the input being connected in a circuit with the floating memristor emulator, and
wherein gain of the output varies in relation to a frequency of a signal at the input, defining an inverting amplifier-floating memristor circuit functioning as an FM discriminator.

16. The floating memristor emulator according to claim 15, further comprising an AM envelope detector having an input and an output, the FM discriminator having an output connected to the input of an AM envelope detector, the envelope detector having an output fully demodulating an FM signal input to the FM discriminator.

* * * * *